(12) United States Patent
Barker et al.

(10) Patent No.: US 11,279,247 B2
(45) Date of Patent: Mar. 22, 2022

(54) ALL ELECTRIC RANGE EXTENDER ELECTRICAL TOPOLOGY FOR A BATTERY ELECTRIC VEHICLE

(71) Applicant: Ford Global Technologies, LLC, Dearborn, MI (US)

(72) Inventors: Jonathan Barker, Ann Arbor, MI (US); Kevin Mackenzie, Canton, MI (US); Liam West, Southfield, MI (US); Gregory Dean Ognjanovski, Shelby Township, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 373 days.

(21) Appl. No.: 16/417,000

(22) Filed: May 20, 2019

(65) Prior Publication Data
US 2020/0369168 A1    Nov. 26, 2020

(51) Int. Cl.
*B60L 53/20* (2019.01)
*B60L 50/62* (2019.01)
*G01R 31/382* (2019.01)
*B60L 50/60* (2019.01)
*B60L 53/16* (2019.01)

(52) U.S. Cl.
CPC .............. *B60L 53/20* (2019.02); *B60L 50/62* (2019.02); *B60L 50/66* (2019.02); *B60L 53/16* (2019.02); *G01R 31/382* (2019.01)

(58) Field of Classification Search
CPC ...................................................... B60L 53/20
USPC ....................................................... 320/132
See application file for complete search history.

(56) References Cited

U.S. PATENT DOCUMENTS

| 9,800,071 B2* | 10/2017 | Martaeng | H02J 7/0068 |
| 2005/0070155 A1* | 3/2005 | Horenstein | H01R 11/288 |
| | | | 439/522 |
| 2008/0111557 A1* | 5/2008 | Elder | H01M 10/0413 |
| | | | 324/511 |
| 2016/0204707 A1* | 7/2016 | Takahara | H02M 1/4258 |
| | | | 363/16 |
| 2020/0136408 A1* | 4/2020 | Rumbaugh | H02J 7/00 |

OTHER PUBLICATIONS

Enginer PHEV Add-on System User Manual for 1997-2003 Prius, Enginer, Inc., Jan. 12, 2011, pp. 1-16.
Enginer PHEV Add-on System User Manual for 2004-2009 Prius, Enginer, Inc., May 1, 2012, pp. 1-24.

* cited by examiner

*Primary Examiner* — Jerry D Robbins
(74) *Attorney, Agent, or Firm* — David B. Kelley; Brooks Kushman P.C.

(57) ABSTRACT

A power converter for an electric vehicle include a connection interface for coupling an external battery to a first bus. The power converter includes a first set of switching devices configured to transfer power between a charge port and the first bus, and a second set of switching devices configured to transfer power between the first bus and a second bus coupled to a traction battery. The power converter includes a controller programmed to control a voltage level of the first bus to different nominal operating voltages based in different operating modes.

18 Claims, 4 Drawing Sheets

ALL ELECTRIC RANGE EXTENDER ELECTRICAL TOPOLOGY FOR A BATTERY ELECTRIC VEHICLE

TECHNICAL FIELD

This application generally relates to a power distribution system for connecting an external battery to an electric vehicle.

BACKGROUND

Widespread adoption of electric vehicles by consumers has been limited by various factors. One factor is that the cost of electric vehicles is generally greater than the cost of competing gasoline powered vehicles. Another factor is referred to as range anxiety or the fear that the electric vehicle will run out of charge without a place to charge. Manufacturers typically address the range anxiety issue by permanently installing a larger battery which further increases the cost and weight of the vehicle.

SUMMARY

A vehicle includes a traction battery. The vehicle further includes a power converter including a connection interface for coupling an external battery to a first bus and a first set of switching devices configured to selectively transfer power between a charge port and the first bus. The power converter further includes a second set of switching devices configured to selectively transfer power between the first bus and a second bus that is coupled to the traction battery. The vehicle further includes a controller programmed to operate the first and second sets to cause a first nominal voltage on the first bus in a first operating mode to transfer power from the charge port to the traction battery and operate the second set to cause a second nominal voltage, different than the first nominal voltage, on the first bus in a second operating mode to transfer power from the connection interface to the traction battery.

The controller may be further programmed to operate the second set to cause the second nominal voltage on the first bus in a third operating mode to charge the external battery coupled to the connection interface from the traction battery. The controller may be further programmed to, responsive to operating in the third operating mode, command contactors associated with the external battery to close and operate the first set to isolate the charge port from the first bus. The controller may be further programmed to transition to the third operating mode responsive to a charger being connected to the charge port and a state of charge of the traction battery exceeding a full charge level and a state of charge of the external battery being less than a predetermined threshold. The controller may be further programmed to transition from the third operating mode to the first operating mode responsive to a state of charge of the traction battery decreasing by a predetermined amount. The controller may be further programmed to, responsive to operating in the first operating mode, command contactors associated with an external battery to open to isolate the external battery from the first bus. The controller may be further programmed to, responsive to operating in the second operating mode, command contactors associated with the external battery to close and operate the first set to isolate the charge port from the first bus. The controller may be further programmed to transition to the first operating mode responsive to a charger being connected to the charge port and a state of charge of the traction battery being less than a predetermined full charge level. The controller may be further programmed to transition to the second operating mode responsive to a charger being disconnected from the charge port and the external battery being connected to the connection interface and power being demanded on the second bus.

A power converter for an electric vehicle includes a connection interface for coupling an external battery to a first bus. The power converter includes a first set of switching devices configured to transfer power between a charge port and the first bus and a second set of switching devices configured to transfer power between the first bus and a second bus coupled to a traction battery. The power converter includes a controller programmed to, responsive to a charger being coupled to the charge port and the external battery being coupled to the connection interface and a state of charge of the traction battery exceeding a predetermined threshold, operate the first set to isolate the charge port and operate the second set to change a nominal voltage of the first bus from a first nominal voltage to a second nominal voltage.

The controller may be further programmed to, responsive to the state of charge of the traction battery falling below a second predetermined threshold, command contactors associated with the external battery to open and operate the first set to couple the charger and change the nominal voltage of the first bus from the second nominal voltage to the first nominal voltage and operate the second set to supply power to the second bus for charging the traction battery. The second nominal voltage may be a voltage associated with the external battery. The controller may be further programmed to, responsive to the charger being decoupled from the charge port, operate the first set to isolate the charge port from the first bus. The controller may be further programmed to, responsive to a power demand on the second bus, operate the second set to transfer power from the first bus to the second bus. The controller may be further programmed to, responsive to the state of charge of the traction battery exceeding the predetermined threshold and a state of charge of the external battery exceeding a predetermined full charge level, operate the first set to isolate the charger and command contactors associated with the external battery to open.

A method includes by a controller, responsive to a charger being coupled to a charge port that is coupled to a first bus via a first set of switching devices, an external battery being coupled to the first bus via a connection interface, and a state of charge of a traction battery coupled to the first bus via a second set of switching devices exceeding a predetermined threshold, operate the first set to isolate the charger and operate the second set to change a nominal voltage of the first bus from a first nominal voltage to a second nominal voltage.

The method may further include, responsive to the state of charge of the traction battery falling below a second predetermined threshold, commanding contactors associated with the external battery to open and operating the first set and the second set to couple the charger and change the nominal voltage of the first bus from the second nominal voltage to the first nominal voltage for charging the traction battery. The method may further include, responsive to the charger being decoupled from the charge port, operating the first set to isolate the charge port from the first bus. The method may further include responsive to a power demand on the second bus, operate the second set to transfer power from the first bus to the second bus. The method may further include, responsive to the state of charge of the traction battery exceeding the predetermined threshold and a state of charge of the external battery exceeding a predetermined full charge level, operate the first set to isolate the charger and command contactors associated with the external battery to open.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
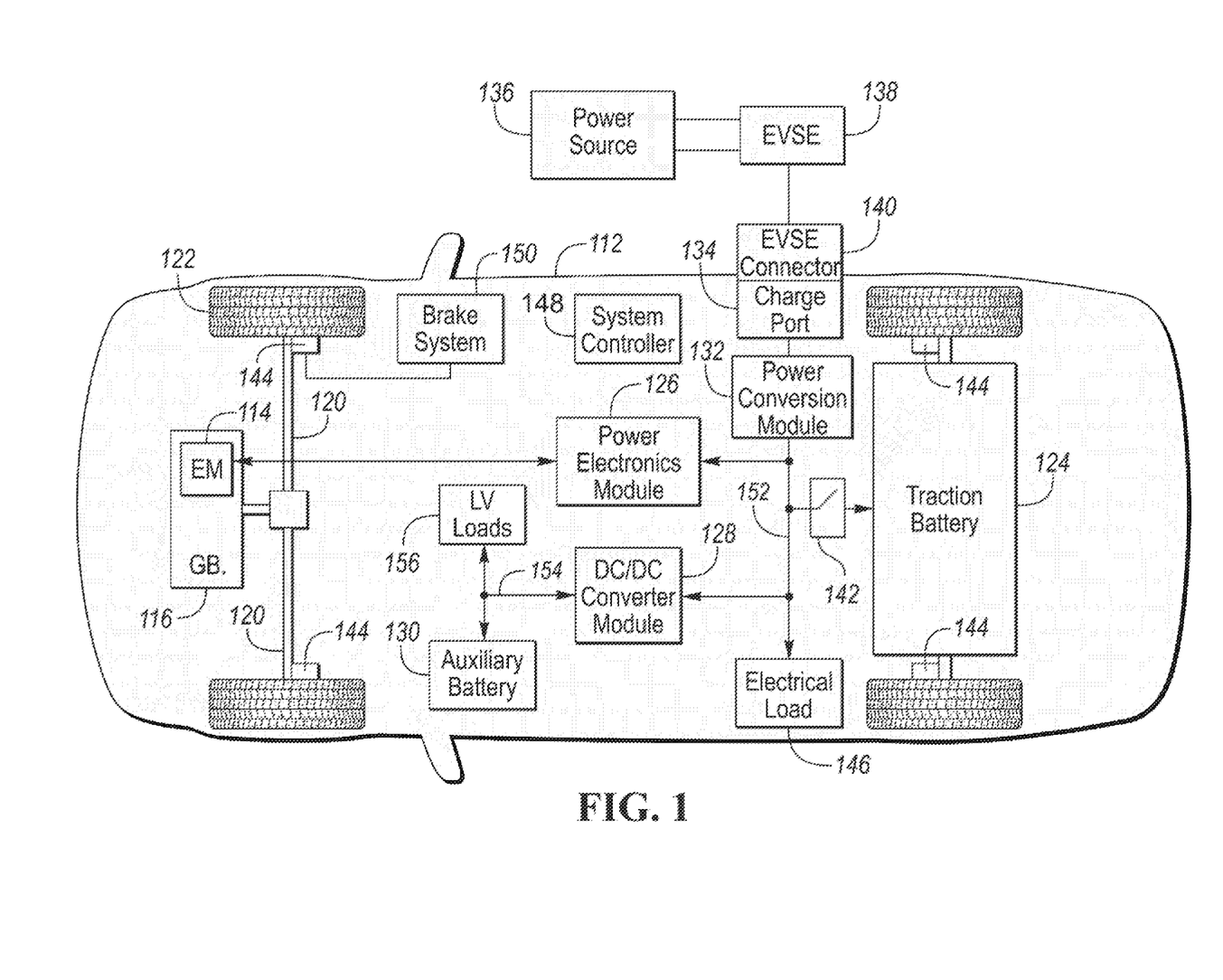
FIG. 1 depicts a possible configuration for an electric vehicle.

FIG. 1 depicts an electrified vehicle 112 that may be referred to as a battery-electric vehicle (BEV). The electrified vehicle 112 may comprise an electric machine 114 mechanically coupled to a gearbox 116. The electric machine 114 may be capable of operating as a motor and a generator. The gearbox 116 may be mechanically coupled to or include a differential 162 that is configured to adjust the speed of drive shafts 120 that are mechanically coupled to drive wheels 122 of the vehicle 112. The drive shafts 120 may be referred to as the drive axle. The electric machines 114 can provide propulsion and deceleration capability. The electric machines 114 may also act as generators and can recover energy that would normally be lost as heat in a friction braking system. In some configurations, a second electric machine and a second gearbox may be coupled to a second axle to provide all-wheel drive capability.

A battery pack or traction battery 124 stores energy that can be used by the electric machine 114. The traction battery 124 may provide a high voltage direct current (DC) output. A contactor module 142 may include one or more contactors configured to isolate the traction battery 124 from a high-voltage bus 152 when opened and connect the traction battery 124 to the high-voltage bus 152 when closed. The high-voltage bus 152 may include power and return conductors for carrying current over the high-voltage bus 152. The contactor module 142 may be integrated with the traction battery 124. A power electronics module 126 may be electrically coupled to the high-voltage bus 152. The power electronics module 126 is also electrically coupled to the electric machine 114 and provides the ability to bi-directionally transfer energy between the traction battery 124 and the electric machine 114. For example, the traction battery 124 may provide a DC voltage while the electric machine 114 may operate with a three-phase alternating current (AC) to function. The power electronics module 126 may convert the DC voltage to a three-phase AC current to operate the electric machine 114. In a regenerative mode, the power electronics module 126 may convert the three-phase AC current from the electric machine 114 acting as a generator to the DC voltage compatible with the traction battery 124.

In addition to providing energy for propulsion, the traction battery 124 may provide energy for other vehicle electrical systems. The vehicle 112 may include a DC/DC converter module 128 that converts the high voltage DC output from the high-voltage bus 152 to a low-voltage DC level of a low-voltage bus 154 that is compatible with low-voltage loads 156. An output of the DC/DC converter module 128 may be electrically coupled to an auxiliary battery 130 (e.g., 12V battery) for charging the auxiliary battery 130. The low-voltage loads 156 may be electrically coupled to the auxiliary battery 130 via the low-voltage bus 154. One or more high-voltage electrical loads 146 may be coupled to the high-voltage bus 152. The high-voltage electrical loads 146 may have an associated controller that operates and controls the high-voltage electrical loads 146 when demanded. Examples of high-voltage electrical loads 146 may be a fan, an electric heating element and/or an air-conditioning compressor.

The electrified vehicle 112 may be configured to recharge the traction battery 124 from an external power source 136. The external power source 136 may be accessed via a connection to an electrical outlet. The external power source 136 may be electrically coupled to a charge station or electric vehicle supply equipment (EVSE) 138. The external power source 136 may be an electrical power distribution network or grid as provided by an electric utility company. The EVSE 138 may provide circuitry and controls to regulate and manage the transfer of energy between the power source 136 and the vehicle 112. The external power source 136 may provide DC or AC electric power to the EVSE 138. The EVSE 138 may have a charge connector 140 for coupling to a charge port 134 of the vehicle 112. The charge port 134 may be any type of port configured to transfer power from the EVSE 138 to the vehicle 112. The charge port 134 may be electrically coupled to an on-board power conversion module or charger 132. The charger 132 may condition the power supplied from the EVSE 138 to provide the proper voltage and current levels to the traction battery 124 and the high-voltage bus 152. The charger 132 may interface with the EVSE 138 to coordinate the delivery of power to the vehicle 112. The EVSE connector 140 may have pins that mate with corresponding recesses of the charge port 134. Alternatively, various components described as being electrically coupled or connected may transfer power using a wireless inductive coupling. For example, the charge port 134 may represent a receive coil and the EVES connector 140 may represent a transmit coil.

The electrified vehicle 112 may include wheel brakes 144 that are provided for decelerating the vehicle 112 and preventing motion of the vehicle 112. The wheel brakes 144 may be hydraulically actuated, electrically actuated, or some combination thereof. The wheel brakes 144 may be a part of a brake system 150. The brake system 150 may include other components to operate the wheel brakes 144. For simplicity, the figure depicts a single connection between the brake system 150 and one of the wheel brakes 144. A connection between the brake system 150 and the other wheel brakes 144 is implied. The brake system 150 may include a controller to monitor and coordinate the brake system 150. The brake system 150 may monitor the brake components and control the wheel brakes 144 for vehicle deceleration. The brake system 150 may respond to driver commands and may also operate autonomously to implement features such as stability control. The controller of the brake system 150 may implement a method of applying a requested brake force when requested by another controller or sub-function.

Electronic modules in the vehicle 112 may communicate via one or more vehicle networks. The vehicle network may include a plurality of channels for communication. One channel of the vehicle network may be a serial bus such as a Controller Area Network (CAN). One of the channels of the vehicle network may include an Ethernet network defined by Institute of Electrical and Electronics Engineers (IEEE) 802 family of standards. Additional channels of the vehicle network may include discrete connections between modules and may include power signals from the auxiliary battery 130. Different signals may be transferred over different channels of the vehicle network. For example, video signals may be transferred over a high-speed channel (e.g., Ethernet) while control signals may be transferred over CAN or discrete signals. The vehicle network may include any hardware and software components that aid in transferring signals and data between modules. The vehicle network is not shown in FIG. 1 but it may be implied that the vehicle network may connect to any electronic module that is present in the vehicle 112. A vehicle system controller (VSC) 148 may be present to coordinate the operation of the various components. Note that operations and procedures that are described herein may be implemented in one or more controllers. Implementation of features that may be described as being implemented by a particular controller is not necessarily limited to implementation by that particular controller. Functions may be distributed among multiple controllers communicating via the vehicle network.

It may be useful to calculate various characteristics of a battery. Quantities such as battery power capability, battery capacity, and battery state of charge may be useful for controlling the operation of a battery as well as any electrical loads receiving power from the battery. Battery power capability is a measure of the maximum amount of power a battery can provide or the maximum amount of power that the battery can receive. Battery capacity is a measure of a total amount of energy that may be stored in a battery. The battery capacity may be expressed in units of Amp-hours. Values related to the battery capacity may be referred to as amp-hour values. The battery capacity of a battery may decrease over the life of the battery.

State of charge (SOC) gives an indication of how much charge remains in a battery. The SOC may be expressed as a percentage of the total charge relative to the battery capacity remaining in the battery. The SOC may also be used by other controllers (e.g., VSC 148) to control the operation of an electric vehicle. Calculation of SOC can be accomplished by a variety of methods. One possible method of calculating SOC is to perform an integration of the battery current over time. This is well-known in the art as ampere-hour integration. Additionally, a relationship between an open-circuit voltage of the battery measured after a rest period and the state of charge may be known. The SOC may be utilized by the vehicle controllers to determine when the battery has achieved a full charge. A full charge may be detected when the SOC is greater than a predetermined threshold (e.g., 95%).

The driving range of the electrified vehicle 112 depends on the amount of charge stored in the traction battery 124. The capacity of the traction battery 124 is determined during design and may incorporate battery technology and developments that are available at production time. It is generally difficult to add battery storage capacity to the electrified vehicle 112 after production as the battery and charging systems are designed with certain capacity limits in mind. Increasing the range of the electrified vehicle generally requires incorporating a larger traction battery 124 with a greater capacity. Incorporating a larger traction battery adds additional weight to the vehicle. An improved solution would be to design the vehicle so that additional increments of battery capacity could be added on an as-needed basis. For example, a BEV owner planning a long trip may want to install extra battery capacity only for the long trip. The BEV owner may be able to rent the battery capacity for the long trip and return the electrified vehicle 112 to the original condition after the trip.

However, merely adding extra battery capacity may be difficult if the electrified vehicle 112 is not configured to support this option. For example, any extra batteries that may be incorporated must connect to the power distribution system of the vehicle in some manner. Without prior design efforts, connection points could present significant safety concerns because of the high-voltages typical in electrified vehicles. The components and strategies defined herein attempt to address the issue of easily connecting and managing additional battery capacity.

An All-Electric Range Extender Solution (AERES) may allow a vehicle owner to temporarily add range by installing an independent battery or other energy storage module. The AERES may be configured to operate as a power source to provide power to the high-voltage bus 152 during vehicle operation. The AERES may be configured to charge the traction battery 124 when the vehicle is not being operated or driven. The AERES may be integrated into the existing vehicle power distribution system with minimal changes. In configurations in which the AERES includes an energy storage module, such as a battery, the energy storage module should be capable of being recharged.

The AERES may interface with an electronic control module to distribute power within the vehicle. In addition to a battery, the AERES may include a fuel cell and/or solar panels to provide energy. In some configurations, the AERES may be implemented as a trailer that includes additional battery capacity.

Figure 2:
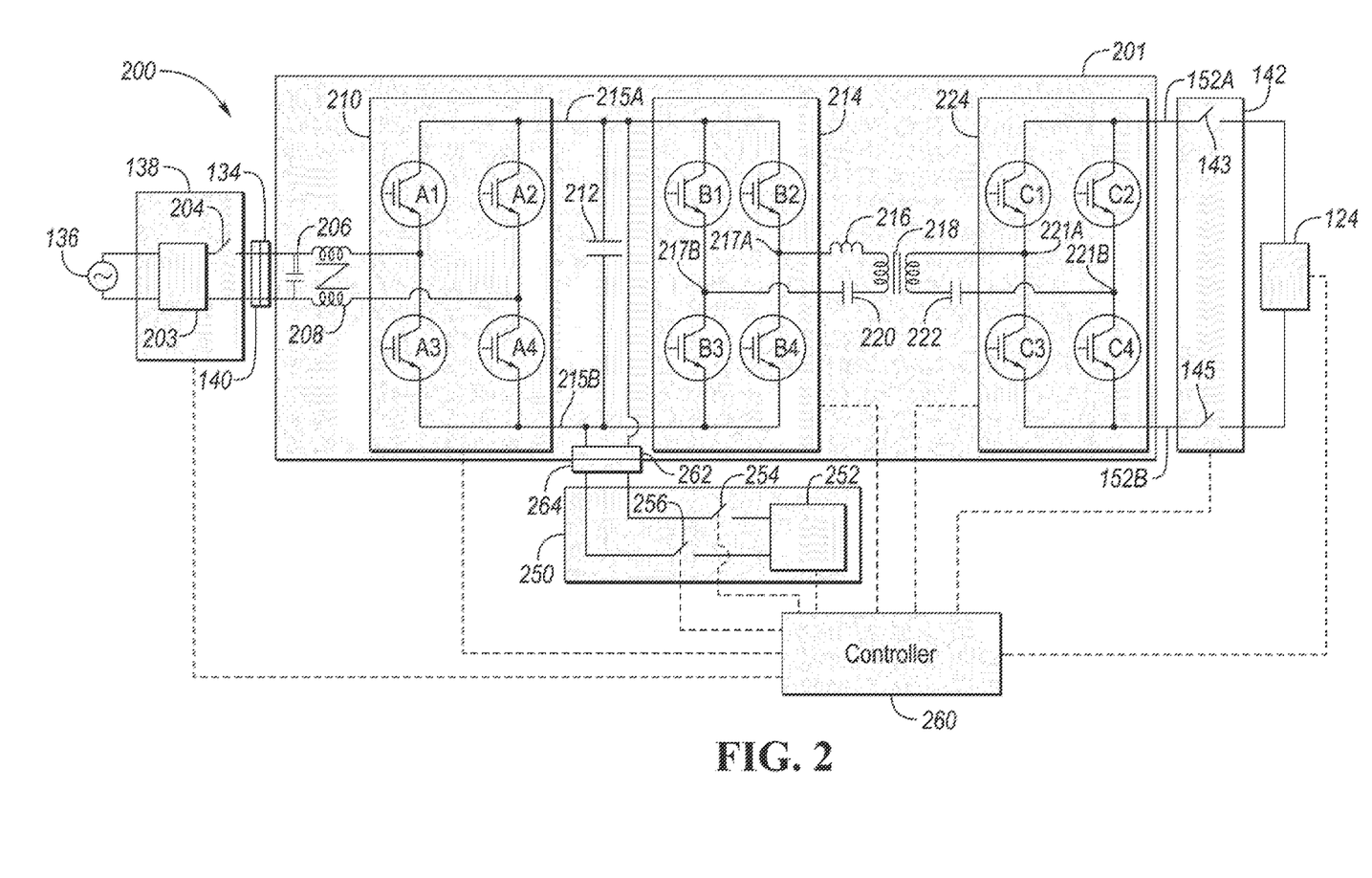
FIG. 2 depicts a possible configuration for a power distribution system for an electric vehicle.

FIG. 2 depicts an example of a power distribution system 200 for the electrified vehicle 112. The power distribution system 200 may be configured to connect to the EVSE 138 through the connector 140 and charge port 134 interface. The EVSE 138 may include circuitry 203 to condition and transfer the external source 136 to the EVSE connector. For example, the circuitry 203 may include components to manage electromagnetic interference (EMI). The circuitry 203 may include components to scale and filter the voltage/current from the external source 136 to a desired amplitude/frequency for the vehicle. The EVSE 138 may include a contactor 204 that is configured to electrically couple the conditioned output to the EVSE connector 140. The output of the EVSE 138 may be an alternating current (AC) voltage/current signal. The output of the EVSE 138 may be coupled to the charge port 134 via the EVSE connector 140.

The electrified vehicle 112 may include a Battery Charge Control Module (BCCM) 201. The BCCM 201 may include circuitry and components to manage the power distribution within the electrified vehicle 112. The BCCM 201 may receive power from the charge port 134 when the EVSE connector 140 is coupled to the charge port 134. For example, terminals or conductors of the BCCM 201 may be electrically coupled to power and return conductors of the charge port 134. The BCCM 201 may be configured to receive an AC power signal from the charge port 134. The BCCM 201 may include a capacitor 206 that is electrically coupled across the received power input. The received power input may be passed through a coupled transformer 208.

The BCCM 201 may include a first stage 210 of switching devices (e.g., A1, A2, A3, A4). The first stage 210 may be configured as a power converter to convert between an AC voltage and a DC voltage. The switching devices may be Insulated Gate Bipolar Transistors (IGBT) arranged in a rectifier configuration. The switching devices may include corresponding antiparallel diodes (not shown). The AC voltage signal from the charge port 134 may be input to the first stage 210. Gate signals of the switching devices may be electrically coupled to a controller 260. The controller 260 may be programmed to operate the switches to convert the AC voltage to a DC output voltage. The output of the first stage 210 may be coupled across a second capacitor 212. The second capacitor 212 may be coupled across an intermediate high-voltage bus 215. The intermediate high-voltage bus 215 may be at a high-voltage DC level and allows the frequency of the AC voltage to be modified between the EVSE 138 and final stages of the power distribution system 200.

The controller 260 may include a microprocessor or processing unit that is configured to execute programs and instructions. The controller 260 may further include volatile and non-volatile memory for storing programs and data. The controller 260 may include timers, counters, and analog-to-digital converters to facilitate processing of inputs and outputs. The controller 260 may also include appropriate interface circuitry for interfacing with the various inputs and outputs.

The BCCM 201 may include a second stage 214 of switching devices (e.g., B1, B2, B3, B4). The switching devices may be Insulated Gate Bipolar Transistors (IGBT) arranged in a bidirectional power converter configuration. The switching devices may include corresponding antiparallel diodes (not shown). The second stage may be configured as a bidirectional power converter to convert between a DC voltage across the second capacitor 212 (also intermediate high-voltage bus 215) and an AC voltage across terminals 217 of the second stage 214. Gate signals of the switching devices may be electrically coupled to the controller 260. In some operating modes, the controller 260 may be programmed to operate the second stage 214 to convert DC voltage across the second capacitor 212 to an AC voltage at the terminals 217 of the second stage 214. In some operating modes, the controller 260 may be programmed to operate the second stage 214 to convert AC voltage supplied at the terminals 217 of the second stage 214 to a DC voltage across the second capacitor 212.

The terminals 217 of the second stage 214 may be electrically coupled to terminals of a transformer 218 through an inductance 216 and a third capacitance 220. The transformer 218 may provide electrical isolation between the terminals 217 of the second stage 214 and later conversion stages.

The BCCM 201 may include a third stage 224 of switching devices (e.g., C1, C2, C3, C4). The switching devices may be Insulated Gate Bipolar Transistors (IGBT) arranged in a bidirectional power converter configuration. The switching devices may include corresponding antiparallel diodes (not shown). The third stage 224 may be configured as a bidirectional power converter to convert between an AC voltage at terminals 221 of the third stage 224 and a DC voltage at the high-voltage bus 152. The high-voltage bus 152 may be electrically coupled to the contactor module 142. The contactor module 142 may include a high-side bus contactor 143 and a low-side bus contactor 145. The contactor module 142 may selectively electrically couple the traction battery 124 to the high-voltage bus 152 by control signals from the controller 260.

The BCCM 201 may further include an AERES connection interface 262. The AERES connection interface 262 may be a connector or port that provides access to the intermediate high-voltage bus 215. The AERES connection interface 262 allows connection of additional energy storage devices. In addition, the AERES connection interface 262 allows the existing stages to be used for transferring energy between the AERES and the high-voltage bus 152. In some configurations, the AERES connection interface 262 may include connection points for connecting to each side or conductor (215A, 215B) that defines the intermediate high-voltage bus 215. In some configurations, the AERES connection interface 262 includes a High-Voltage Interlock (HVIL) interface. For example, the HVIL interface may be used to isolate any high-voltage power sources from the connectors when a connector is unplugged. The HVIL interface may include a signal conductor that is routed through all high-voltage connectors. When any of the connectors are disconnected, the signal may change state and cause the contactors to be opened. The AERES connection interface 262 may further include a power interface and a signal interface.

An AERES module 250 may be connected to or installed in the electrified vehicle 112. The AERES module 250 may include an energy storage device 252 such as a battery. The AERES may include an AERES connector 264 that is configured to interface with the AERES connection interface 262 to electrically couple the AERES module 250 to the intermediate high-voltage bus 215. The AERES module 250 may further include a first contactor 254 and a second contactor 256 that are configured to selectively electrically couple the energy storage device 252 to terminals of the AERES connector 264. The AERES connector 264 may also include a signal interface for transferring signals through the AERES connection interface 262 to the controller 260. For example, the signal interface may be configured to enable the controller 260 to operate the first contactor 254 and the second contactor 256. The signal interface may also include a communication link with a control module of the AERES module 250. The controller 260 may be configured to command the contactors to the open and closed states via the signal interface.

The electrical topology described allows the AERES module 250 to feed power to the traction battery 124 while providing electrical isolation with the EVSE 138. To isolate the charge port 134 from the AERES module 250, the switching devices of the first stage 210 may be commanded to the open state. When the switching devices of the first stage 210 are opened, the charge port is isolated from the intermediate high-voltage bus 215.

When the AERES module 250 is not present in the vehicle, a dummy plug may be coupled to the AERES connection interface 262. The dummy plug may include connections to complete the High-Voltage Interlock (HVIL) circuit. If the dummy plug is removed, the HVIL circuit opens, causing the contactors (e.g., 143, 145) in the power distribution system 200 to open immediately.

The controller 260 may be programmed to implement a control strategy for managing the AERES module 250. The power distribution system 200 may be operated in several distinct modes. A first mode of operation may be an external charging mode. In the external charging mode, energy may be transferred from the external source 136 to the traction battery 124. In this mode, the AERES module 250 may be isolated from the intermediate high-voltage bus 215.

A second mode of operation may be an AERES charging mode. In the AERES charging mode, energy may be transferred from the traction battery 124 to the AERES module 250. In this mode, the EVSE 138 may be isolated from the intermediate high-voltage bus 215.

A third mode of operation may be an AERES depleting mode. In the AERES depleting mode, energy may be transferred from the AERES module 250 to the high-voltage bus 152. In this mode, the charge port 134 and EVSE 138 may be isolated from the intermediate high-voltage bus 215.

The BCCM 201 may facilitate the transfer of energy between the various sources and energy storage devices. The nominal voltage level of the high-voltage bus 152 may be dictated by the traction battery 124 and connected loads. The voltage level of the intermediate high-voltage bus 215 may be different than the voltage level of the high-voltage bus 152. The AERES module 250 may be defined to have different voltage levels. The power distribution system 200 may support different voltage levels for the intermediate high-voltage bus 215 to accommodate a variety of AERES module 250 specifications. For example, the AERES module 250 may be designed with different battery capacities and nominal voltage levels.

The BCCM 201 configuration allows the voltage level of the intermediate high-voltage bus 215 to be adjusted when the AERES module 250 is connected. The voltage level of the AERES module 250 may be reported to the controller 260 via the AERES connection interface 262. The BCCM 201 allows the voltage level to change based on the mode of operation as will be described herein.

Operation in the external charging mode when the EVSE 138 and the AERES module 250 are connected may be described as follows. The controller 260 may monitor the state of charge of the traction battery 124. While the traction battery 124 is less than fully charged (e.g., <99% SOC), the power distribution system 200 may be operated to charge the traction battery 124. During traction battery charging, the AERES contactors 254, 256 may be commanded to the open state to isolate the AERES energy storage device 252 from the intermediate high-voltage bus 215. The first stage 210 may be operated to maintain the intermediate high-voltage bus 215 at a predetermined voltage level for charging the traction battery 124. The second stage 214 may be operated to convert the DC voltage of the intermediate high-voltage bus 215 to an AC voltage having a predetermined amplitude and frequency. The input the third stage 224 may be an AC voltage. The third stage 224 may be operated to convert the AC voltage to a DC voltage at a level for charging the traction battery 124.

The operating parameters such as the predetermined voltage level of the intermediate high-voltage bus 215 and the amplitude and frequency of the voltage provided to the transformer 218 may be selected to optimize the energy transfer for charging the traction battery 124 from the external source 136. The intermediate high-voltage bus 215 may be maintained at a nominal voltage level to match the predetermined voltage level. The nominal voltage level may define a rated voltage level and may represent a setpoint for the desired operating mode. As such, the actual voltage may vary about the nominal voltage level. The controller 260 may operate the switching devices to control the voltage level to the nominal voltage level. The nominal voltage level may be dependent on the operating mode.

In the external charging mode, a first set of switching devices (defined as the first stage 210) may be operated to maintain a first nominal voltage across the intermediate high-voltage bus 215. A second set of switching devices (defined as the second stage 214 and the third stage 224) may be operated to transfer energy from the intermediate high-voltage bus 215 to the high-voltage bus 152 and maintain the high-voltage bus 152 at a predetermined voltage level. The predetermined voltage level may be a voltage level that is capable of charging the traction battery 124. For example, the predetermined voltage level may be a voltage that is greater than the open-circuit voltage of the traction battery 124.

When the traction battery 124 becomes fully charged (e.g., 100% SOC), the power distribution system 200 may be operated to support charging of the AERES module 250 (transition to AERES charging mode). In the AERES charging mode, the set of switching devices (first stage 210) may be operated to open the switching devices. When the switching devices are operated in the open state, no current can flow between the EVSE 138 and the intermediate high-voltage bus 215. In this state, the EVSE 138 and charge port 134 are isolated from the other stages. In the AERES charging mode, the traction battery 124 may provide energy to charge the AERES module 250. The AERES contactors 254, 256 may be operated in the closed state to electrically couple the intermediate high-voltage bus 215 to the AERES storage device 252. The controller 260 may monitor the state of charge of the AERES energy storage device 252.

The nominal voltage level of the intermediate high-voltage bus 215 may be selected to be compatible with the AERES energy storage device 252. In some configurations, the nominal voltage level for charging the AERES energy storage device 252 may be different than the nominal voltage level for transferring energy between the EVSE 138 and the traction battery 124. Prior to coupling the AERES energy storage device 252 via the contactors 254, 256 the controller 260 may operate the switching devices of the second set of switching devices (e.g., second stage 214 and the third stage 224) to set the voltage of the intermediate high-voltage bus 215 to the desired nominal voltage level. The voltage level of the intermediate high-voltage bus 215 may be selected as the charging voltage for the AERES energy storage device 252. For example, the nominal voltage level of the intermediate high-voltage bus 215 may be set to a value greater than the open-circuit voltage of the AERES energy storage device 252.

The third stage 224 may be operated to convert the DC voltage from the traction battery 124/high-voltage bus 152 to an AC voltage that is input to a winding of the transformer 218. The other winding of the transformer 218 may supply the second stage 214 (terminals 217) with an AC voltage. The third stage 224 may be operated to provide the AC voltage with a predetermined amplitude and frequency. The second stage 214 may be operated to convert the AC voltage from the transformer 218 to a DC voltage at the intermediate high-voltage bus 215. Note that the nominal voltage level in this mode of operation may be different than the nominal voltage level in the external charging mode.

In the AERES charging mode, the first set of switching devices (defined as the first stage 210) may be operated to isolate the charge port 134 from the intermediate high-voltage bus 215. The second set of switching devices (defined as the second stage 214 and the third stage 224) may be operated to transfer energy from the high-voltage bus 152/traction battery 124 to the intermediate high-voltage bus 215 and maintain the intermediate high-voltage bus 215 at a nominal voltage level to facilitate charging of the AERES energy storage device 252.

The controller 260 may monitor the charging of the AERES energy storage device 252. In addition, the controller 260 may monitor the amount of charge depleted from the traction battery 124 (e.g., change in the state of charge). The controller 260 may monitor the reduction in the state of charge of the traction battery 124. The controller 260 may interrupt the charging of the AERES energy storage device 252 responsive to the state of charge of the traction battery 124 being reduced by a predetermined amount. For example, the controller 260 may allow a five percent change in traction battery state of charge. The controller 260 may also monitor the state of charge of the AERES energy storage device 252. Charging of the AERES energy storage device 252 may be terminated when the state of charge of the AERES energy storage device 252 exceeds a predetermined full charge threshold. The predetermined full charge threshold may be a level indicative of a full charge or may be a user defined threshold.

After terminating charging of the AERES energy storage device 252, the controller 260 may operate the power distribution system 200 to charge the traction battery 124. The controller 260 may transition to the external charging mode as described above. The power distribution system 200 may alternate between the external charging mode and the AERES charging mode until the AERES energy storage device 252 and the traction battery 124 are charged to the corresponding full charge values. When the traction battery 124 and the AERES energy storage device 252 are fully charged, all contactors may be opened.

When the EVSE connector 140 is disconnected from the charge port 134, the system may operate in the AERES depleting mode. The controller 260 may transition to the AERES depleting mode responsive to a power demand on the high-voltage bus 152. In the AERES depleting mode, energy from the AERES energy storage device 252 may be supplied to the high-voltage bus 152. In some configurations, the AERES energy storage device 252 may supplement the energy provided by the traction battery 124. That is, both the traction battery 124 and the AERES energy storage device 252 may provide power to the high-voltage bus 152. In other configurations, the AERES energy storage device 252 may be used responsive to the state of charge of the traction battery 124 falling below a threshold.

In the AERES depleting mode of operation, the controller 260 may operate the switching devices of the first stage 210 to isolate the charge port 134 from the intermediate high-voltage bus 215. For example, the switching devices may be commanded to be in the open or non-conductive state. The controller 260 may command the AERES contactors 254, 256 to the closed state to electrically couple the intermediate high-voltage bus 215 to the AERES energy storage device 252. The AERES energy storage device 252 may provide a nominal voltage on the intermediate high-voltage bus 215 that is the nominal voltage rating of the AERES energy storage device 252. The nominal voltage may be different than the nominal voltage of the high-voltage bus 152. The controller 260 may operate the switching devices of the second stage 214 to convert the DC voltage of the intermediate high-voltage bus 215 to an AC voltage at the terminals 217 of the second stage 214. The AC voltage feeds the transformer 218 that provides an AC voltage at terminals 221 of the third stage 224. The AC voltage amplitude at the terminals 221 of the third stage 224 may be different than the AC voltage amplitude at the terminals 217 of the second stage 214. For example, the amplitude may be affected by a turns ratio of the transformer 218. The controller 260 may control the frequency of the AC voltage by controlling the switching devices.

The controller 260 may transition to the AERES depleting mode responsive to the EVSE 138 being decoupled from the charge port 134, the AERES module 250 being connected to the AERES connection interface 262, and the presence of a demand for power on the high-voltage bus 152. The demand for power on the high-voltage bus 152 may be associated with an ignition on condition of the vehicle (e.g., key in run position). In the AERES depleting mode, the first set of switching devices (defined as the first stage 210) may be operated to isolate the charge port 134 from the intermediate high-voltage bus 215. The second set of switching devices (defined as the second stage 214 and the third stage 224) may be operated to transfer energy from the intermediate high-voltage bus 215 to the high-voltage bus 152 to maintain the high-voltage bus 152 at a nominal voltage level of the traction battery 124.

The controller 260 may be programmed to monitor the states of charge of the traction battery 124 and the AERES energy storage device 252, when connected. The controller 260 may also monitor the connection status of the EVSE 138. The controller 260 may transition between the operating modes based on the described conditions to extend the range of the vehicle 112 and to manage charging of both the traction battery 124 and the AERES energy storage device 252.

Figure 3:
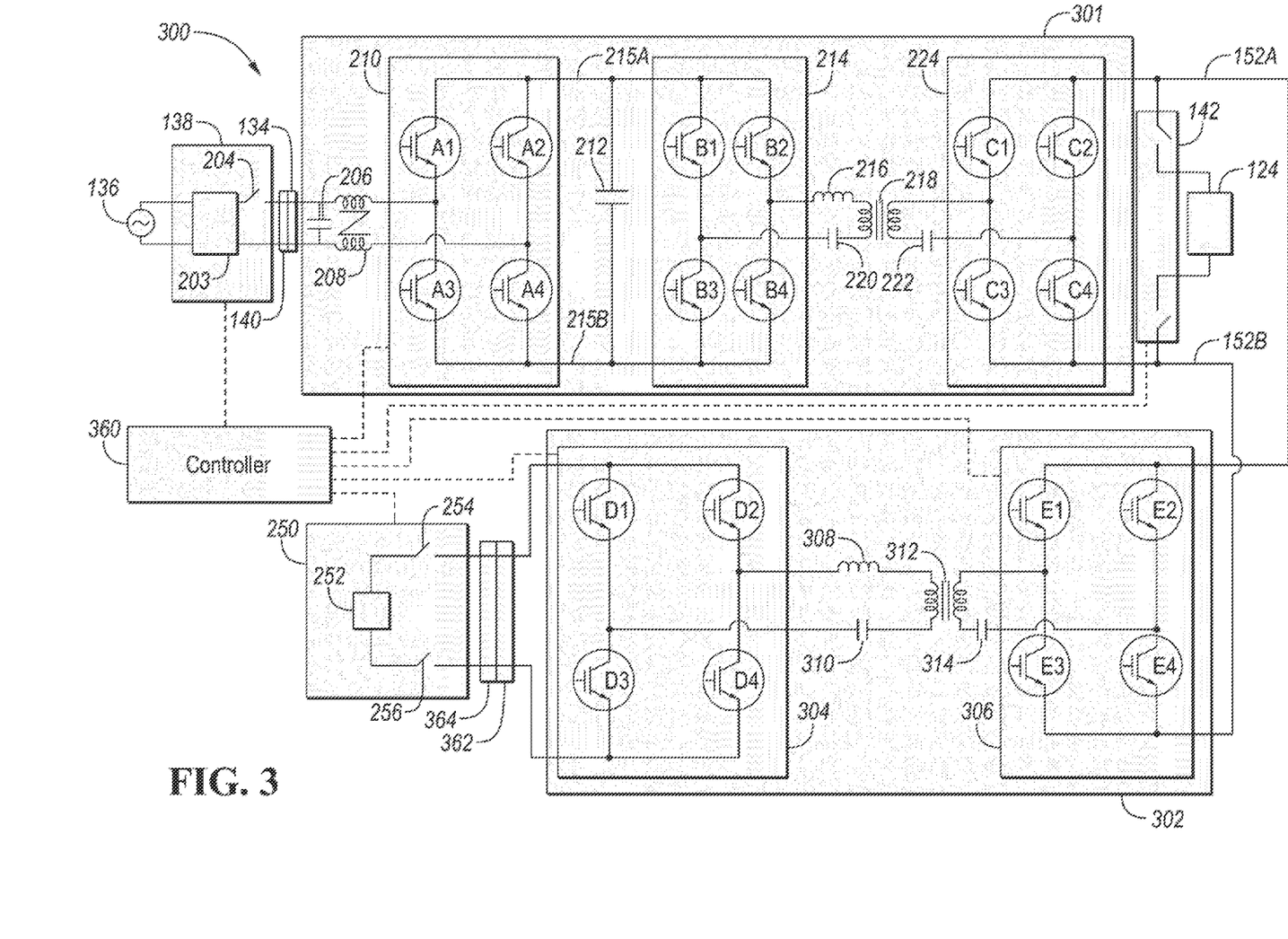
FIG. 3 depicts an alternative configuration for a power distribution system for an electric vehicle.

FIG. 3 depicts an alternative power distribution system 300. Elements having the same reference numbers may operate as described previously and the description may not be repeated. The power distribution system 300 may include a BCCM 301. The BCCM 201 may include circuitry and components to manage the power distribution within the electrified vehicle 112. The BCCM 301 may receive power from the charge port 134 when the EVSE connector 140 is coupled to the charge port 134. For example, terminals or conductors of the BCCM 301 may be electrically coupled to power and return conductors of the charge port 134. The BCCM 301 may be configured to receive an AC power signal from the charge port 134. The BCCM 301 may include a capacitor 206 that is electrically coupled across the received power input. The received power input may be passed through a coupled transformer 208. The main difference in the BCCM 301 configuration is the removal of the AERES connection interface 262 that connects to the intermediate high-voltage bus 215. In this configuration, the BCCM 301 may not directly interface with the AERES module 250.

The BCCM 301 may include the first stage 210, the second stage 214, and the third stage 224 that are configured to transfer power between the EVSE 138 and the traction battery 124. The power distribution system 300 may include a controller 360 that is configured to operate the switching devices and control the overall transfer of power between components.

The power distribution system 300 may include an AERES converter module 302 that is configured to transfer power between the high-voltage bus 152 and the AERES module 250. In this configuration, the AERES converter module 302 is electrically coupled to the high-voltage bus 152 in a manner similar to other high-voltage electrical loads. In this configuration, the intermediate high-voltage bus 215 is not coupled to the AERES module 250.

The power distribution system 300 may further include an AERES connection interface 362 that is configured to connect the AERES module 250 to the AERES converter module 302. The AERES module 250 may include a cable or connector 364 that is configured to connect to the AERES connection interface 362. The AERES connector 364 may include power and signal conductors to enable transfer of power and control signals between the controller 360 and the AERES module 250. The AERES connector 364 may include HVIL signals that cooperate with the HVIL system to ensure safety. When the AERES connector 364 is not connected to the AERES connection interface 362, the power distribution system 300 may isolate all high-voltage sources from the high-voltage buses. To operate the vehicle without the AERES module 250, a dummy plug may be inserted in the AERES connection interface 362. The dummy plug may provide the correct HVIL signals to permit operation of the power distribution system 300.

The AERES converter module 302 may include a first stage 306 of switching devices (e.g., E1, E2, E3, E4) arranged in a bidirectional power converter to convert between a DC voltage on the high-voltage bus 152 and an AC voltage across a first winding of a transformer 312. The AERES converter module 302 may include a second stage 304 of switching devices (e.g., D1, D2, D3, D4) arranged as a bidirectional power converter to converter between a DC voltage of the AERES module 250 to an AC voltage across a second winding of the transformer 312. The AERES converter module 302 may further include an inductance 308 and a first capacitance coupled between the second stage 304 and the second winding of the transformer 312. The AERES converter module 302 may further include a second capacitance 314 coupled between the first stage 306 and the first winding of the transformer 312.

The AERES module 250 may be as described previously. The AERES converter module 302 may be operative to transfer power between the AERES energy storage device 252 and the high-voltage bus 152. A charging strategy may be implemented by the controller 360. The controller 360 may be programmed to first charge the traction battery 124 to a predetermined charge level. In the traction battery charging mode, the controller 360 may command the AERES contactors 254, 256 to be open. When the traction battery 124 has met or exceeded a predetermined state of charge representing a full charge, the controller 360 may command the AERES contactors 254, 256 to close.

The controller 360 may then operate the power distribution system 300 to charge the AERES energy storage device 252. The controller 360 may determine the charge current that is needed to charge the AERES energy storage device 252. For example, the controller 360 may receive AERES module 250 parameters via the AERES connection interface 362. The controller 360 may then operate the BCCM 301 to provide the charging current to the high-voltage bus 152. The controller 360 may then operate the AERES converter module 302 to provide a charging voltage to the AERES energy storage device 252. The controller 360 may be configured to operate the switching devices to generate the proper amplitude and frequency for efficiently transferring power to the AERES energy storage device 252.

When the EVSE 138 is not connected, the controller 360 may operate the AERES converter module 302 to transfer power from the AERES energy storage device 252 to the high-voltage bus 152. The controller 360 may initiate the energy transfer responsive to a power demand on the high-voltage bus 152. When the power demand is detected, the controller 360 may command the AERES contactor 254, 256 to close. The controller 360 may then operate the AERES converter module 302 to transfer energy from the AERES energy storage device 252 to the high-voltage bus 152.

In another mode of operation, the traction battery 124 may be charged from the external source 136 and the AERES energy storage device 252 at the same time. In this mode of operation, the controller 360 may operate the BCCM 301 to transfer energy from the external source 136 to the high-voltage bus 152. The controller 360 may operate the AERES contactors 254, 256 to couple the AERES energy storage device 252 to the AERES converter module 302. The controller 360 may operate the switching devices of the AERES converter module 302 (first stage 306 and second stage 304) to output a current to the high-voltage bus 152 for charging the traction battery 124. This mode of operation permits faster charging of the traction battery 124. When the traction battery 124 has achieved a full charge level (e.g., at or near 100% SOC), the main contactors 142 may be opened. The controller 360 may continue to operate the BCCM 301 to transfer energy to the high-voltage bus 152 for charging the AERES energy storage device 252. During this time, the controller 360 may operate the AERES converter module 302 to transfer energy from the high-voltage bus 152 to the AERES energy storage device 252. Further, in this mode of operation, the voltage level of the high-voltage bus 152 may be changed from the first nominal voltage level to a second nominal voltage level. The first nominal voltage level may be a level suitable for efficiently charging the traction battery 124. The second nominal voltage level may be a level suitable for efficiently charging the AERES energy storage device 252. When the state of charge of the AERES energy storage device 252 exceeds a full charge threshold, the controller 360 may open the AERES contactors 254, 256 to isolate the AERES energy storage device 252. The controller 360 may operate the BCCM 301 to stop transferring energy from the external source 136. This traction battery dual-charging mode may allow for more rapid charging of the traction battery.

The main difference between the power distribution systems is that the power distribution system of FIG. 2 does not use a separate power converter. The system of FIG. 2 can utilize a single power converter to manage the power flow between components. The configuration of FIG. 3 may be simpler to incorporate into the power distribution system but requires the additional power converter which may add cost to the vehicle.

Figure 4:
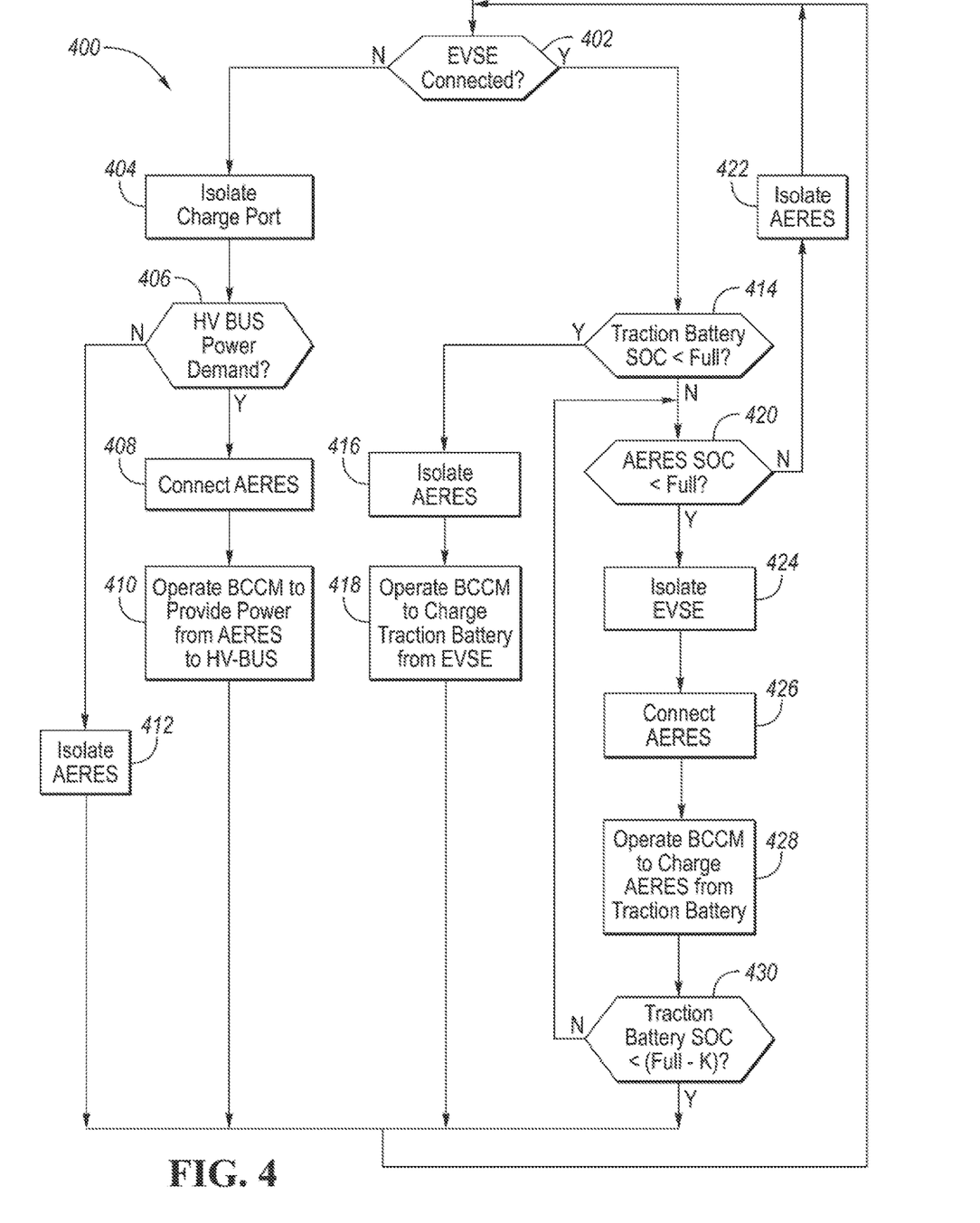
FIG. 4 depicts a flow chart for a possible set of operations for operating a power distribution system.

FIG. 4 depicts a flow chart for a possible sequence of operations for controller the BCCM 201 when that AERES module 250 is coupled via the AERES connection interface 262. At operation 402, a check may be performed to determine if the EVSE 138 is connected. For example, the controller 260 may determine if the EVSE connector 140 is coupled to the charge port 134 via a hardware signal. The connection may also be detected if the controller 260 establishes communication with the EVSE 138. If the EVSE 138 is connected, then operation 414 may be performed.

At operation 414, a check may be performed to determine if the state of charge of the traction battery 124 is less than a predetermined threshold. The predetermined threshold may be a state of charge level that is indicative of a full state of charge. If the traction battery state of charge is less than the full level, then charging of the traction battery 124 may be performed. At operation 416, the AERES module 250 may be isolated from the intermediate high-voltage bus 215.

For example, the controller 260 may command the AERES contactors 254, 256 to open. At operation 418, the controller 260 may operate the BCCM 201 to charge the traction battery 124 from the EVSE 138. The controller 260 may operate the switching devices to transfer power between the EVSE 138 and the high-voltage bus 152. In this mode of operation, the nominal voltage of the intermediate high-voltage bus 215 may be controlled to a first nominal voltage level. The first nominal voltage level may be a voltage level that allows for maximizing efficiency of the energy transfer to the traction battery 124.

If the traction battery state of charge has reached the full charge level at operation 414, then the AERES energy storage device 252 may be charged from the traction battery 124. At operation 420, a check may be performed to determine if the state of charge of the AERES energy storage device 252 is less than a full charge level. If the AERES state of charge is less than the full charge level, the AERES energy storage device 252 may be charged from the traction battery 124. At operation 424, the charge port 134 and the EVSE 138 may be isolated from the intermediate high-voltage bus 215. For example, the first set of switching devices (e.g., first stage 210) may be commanded to the open or non-conducting state. At operation 426, the AERES energy storage device 252 may be connected to the intermediate high-voltage bus 215. For example, the controller 260 may command the AERES contactors 254, 256 to close. At operation 428, the BCCM 201 may be operated to charge the AERES energy storage device 252 from the traction battery 124. For example, the controller 260 may operate the second set of switches to transfer energy from the traction battery 124 to the AERES energy storage device 252. In this mode of operation, the nominal voltage level of the intermediate high-voltage bus 215 may be controlled at a second nominal voltage level. The second nominal voltage level may be different than the first nominal voltage level used when charging the traction battery 124. The second nominal voltage may be a voltage level that is above a rated voltage of the AERES energy storage device 252.

At operation 430, a check may be performed to determine if the traction battery state of charge has fallen a predetermined amount (e.g., K) below the full charge level. For example, the predetermined amount may be ten percent. If the traction battery state of charge has fallen below the predetermined level, operations starting at 402 may be repeated. The expected result may be that the system may transition to the traction battery charging mode. If the traction battery state of charge has not fallen below the predetermined level, operations starting at operation 420 may be repeated (e.g., continue charging AERES energy storage device 252 from the traction battery 124).

At operation 402, if the EVSE is not connected, operation 404 may be performed. At operation 404, the charge port may be isolated from the intermediate high-voltage bus 215. For example, the first stage 210 may be operated such that switching devices are in the open or non-conducting state. At operation 406, a check may be performed to determine if a demand for power from the high-voltage bus 152 is present. A demand for power may correspond to an ignition run condition (e.g., key in run position, start button pressed). The demand for power may correspond to a current draw from the high-voltage bus 152 exceeding a predetermined threshold. If there is not demand for power from the high-voltage bus 152, operation 412 may be performed to isolate the AERES energy storage device 252 from the intermediate high-voltage bus 215. For example, the controller 260 may command the AERES contactors 254, 256 to the open state to isolate the AERES energy storage device 252.

If there is a demand for power, operation 408 may be performed. At operation 408, the AERES energy storage device 252 may be connected to the intermediate high-voltage bus 215. For example, the controller 260 may command the AERES contactors 254, 256 to the closed or conducting state. At operation 410, the BCCM 201 may be operated to provide power to the high-voltage bus 152 from the AERES energy storage device 252. For example, the controller 260 may operate the switching devices to transfer energy from the intermediate high-voltage bus 215 to the high-voltage bus 152 as described previously herein. Operations starting from operation 402 may be repeated.

The power distribution system allows existing components to be utilized with minimal changes to extend the range of the electrified vehicle. The system allows battery modules with different specifications to be connected to the vehicle. The system allows the vehicle range to be increased when needed without adding additional cost to the vehicle. Range-extending capacity may be rented or leased for periods of time that it is needed. The system allows for battery capacity to be increased with battery technology that may not have been available at the time of vehicle purchase.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle comprising:
a traction battery;
a power converter including a connection interface for coupling an external battery to a first bus and a first set of switching devices configured to selectively transfer power between a charge port and the first bus, and a second set of switching devices configured to selectively transfer power between the first bus and a second bus that is coupled to the traction battery; and
a controller programmed to
operate the first and second sets to cause a first nominal voltage on the first bus in a first operating mode to transfer power from the charge port to the traction battery and operate the second set to cause a second nominal voltage, different than the first nominal voltage, on the first bus in a second operating mode to transfer power from the connection interface to the traction battery,
operate the second set to cause the second nominal voltage on the first bus in a third operating mode to charge the external battery coupled to the connection interface from the traction battery, and
transition to the third operating mode responsive to a charger being connected to the charge port and a state of charge of the traction battery exceeding a full charge level and a state of charge of the external battery being less than a predetermined threshold.

2. The vehicle of claim 1, wherein the controller is further programmed to, responsive to operating in the third operating mode, command contactors associated with the external battery to close and operate the first set to isolate the charge port from the first bus.

3. The vehicle of claim 1, wherein the controller is further programmed to transition from the third operating mode to the first operating mode responsive to a state of charge of the traction battery decreasing by a predetermined amount.

4. The vehicle of claim 1, wherein the controller is further programmed to, responsive to operating in the first operating mode, command contactors associated with an external battery to open to isolate the external battery from the first bus.

5. The vehicle of claim 1, wherein the controller is further programmed to, responsive to operating in the second operating mode, command contactors associated with the external battery to close and operate the first set to isolate the charge port from the first bus.

6. The vehicle of claim 1, wherein the controller is further programmed to transition to the first operating mode responsive to a charger being connected to the charge port and a state of charge of the traction battery being less than a predetermined full charge level.

7. The vehicle of claim 1, wherein the controller is further programmed to transition to the second operating mode responsive to a charger being disconnected from the charge port and the external battery being connected to the connection interface and power being demanded on the second bus.

8. A power converter for an electric vehicle comprising:
a connection interface for coupling an external battery to a first bus;
a first set of switching devices configured to transfer power between a charge port and the first bus;
a second set of switching devices configured to transfer power between the first bus and a second bus coupled to a traction battery; and
a controller programmed to, responsive to a charger being coupled to the charge port and the external battery being coupled to the connection interface and a state of charge of the traction battery exceeding a predetermined threshold, operate the first set to isolate the charge port and operate the second set to change a nominal voltage of the first bus from a first nominal voltage to a second nominal voltage.

9. The power converter of claim 8, wherein the controller is further programmed to, responsive to the state of charge of the traction battery falling below a second predetermined threshold, command contactors associated with the external battery to open and operate the first set to couple the charger and change the nominal voltage of the first bus from the second nominal voltage to the first nominal voltage and operate the second set to supply power to the second bus for charging the traction battery.

10. The power converter of claim 8, wherein the second nominal voltage is a voltage associated with the external battery.

11. The power converter of claim 8, wherein the controller is further programmed to, responsive to the charger being decoupled from the charge port, operate the first set to isolate the charge port from the first bus.

12. The power converter of claim 11, wherein the controller is further programmed to, responsive to a power demand on the second bus, operate the second set to transfer power from the first bus to the second bus.

13. The power converter of claim 8, wherein the controller is further programmed to, responsive to the state of charge of the traction battery exceeding the predetermined threshold and a state of charge of the external battery exceeding a predetermined full charge level, operate the first set to isolate the charger and command contactors associated with the external battery to open.

14. A method comprising:
by a controller,
responsive to a charger being coupled to a charge port that is coupled to a first bus via a first set of switching devices, an external battery being coupled to the first bus via a connection interface, and a state of charge of a traction battery coupled to the first bus via a second set of switching devices exceeding a predetermined threshold, operate the first set to isolate the charger and operate the second set to change a nominal voltage of the first bus from a first nominal voltage to a second nominal voltage.

15. The method of claim 14 further comprising, responsive to the state of charge of the traction battery falling below a second predetermined threshold, commanding contactors associated with the external battery to open and operating the first set and the second set to couple the charger and change the nominal voltage of the first bus from the second nominal voltage to the first nominal voltage for charging the traction battery.

16. The method of claim 14 further comprising, responsive to the charger being decoupled from the charge port, operating the first set to isolate the charge port from the first bus.

17. The method of claim 16 further comprising responsive to a power demand on the second bus, operate the second set to transfer power from the first bus to the second bus.

18. The method of claim 14 further comprising, responsive to the state of charge of the traction battery exceeding the predetermined threshold and a state of charge of the external battery exceeding a predetermined full charge level, operate the first set to isolate the charger and command contactors associated with the external battery to open.

* * * * *